United States Patent
Huang

(10) Patent No.: US 10,698,323 B2
(45) Date of Patent: Jun. 30, 2020

(54) TEST KEY LAYOUT AND METHOD OF MONITORING PATTERN MISALIGNMENTS USING TEST KEYS

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Tsai-Yu Huang, Hsinchu County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/019,555

(22) Filed: Jun. 27, 2018

(65) Prior Publication Data

US 2019/0051567 A1 Feb. 14, 2019

(30) Foreign Application Priority Data

Aug. 11, 2017 (CN) .......................... 2017 1 0684341

(51) Int. Cl.
*H01L 21/66* (2006.01)
*G03F 7/20* (2006.01)

(52) U.S. Cl.
CPC ...... *G03F 7/70683* (2013.01); *G03F 7/70658* (2013.01); *H01L 22/34* (2013.01)

(58) Field of Classification Search
CPC .............................. H01L 22/10; H01L 22/14
See application file for complete search history.

(56) References Cited

U.S. PATENT DOCUMENTS

| | | | |
|---|---|---|---|
| 5,617,340 | A | 4/1997 | Cresswell |
| 2013/0048979 | A1 | 2/2013 | Piper |

*Primary Examiner* — Walter H Swanson
(74) *Attorney, Agent, or Firm* — Winston Hsu

(57) ABSTRACT

A set of test key layout including multiple test keys and method of monitoring layout pattern misalignments using the test keys is provided. Each test key is composed of a testing electrode, an operating voltage ($V_{dd}$) line and a grounding voltage ($V_{ss}$) line, wherein the patterns of test keys are defined by an overlapped portion of a first exposure pattern and a second exposure pattern, and the position of testing electrode is shifted sequentially in one direction in order of the test keys.

5 Claims, 5 Drawing Sheets

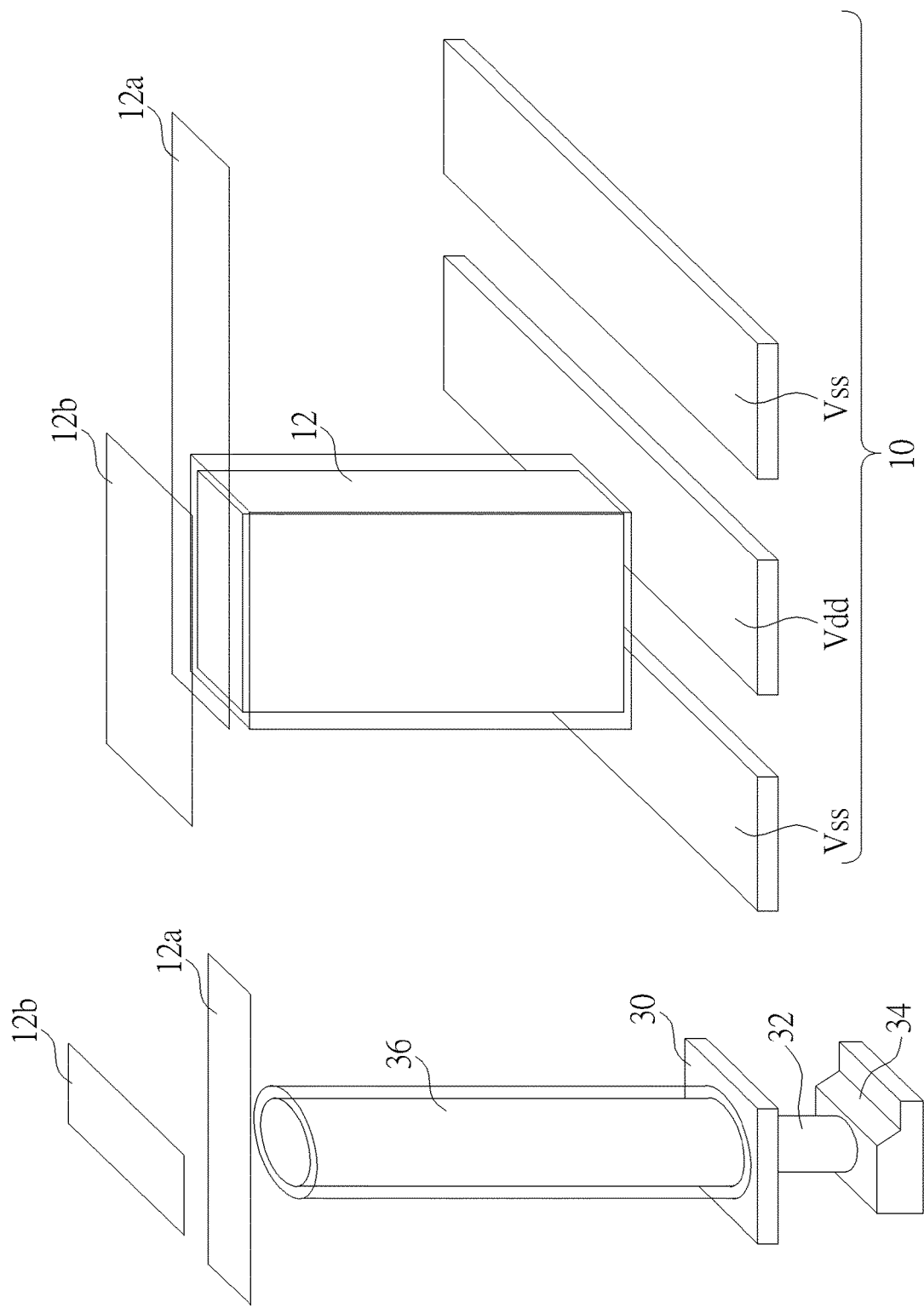

TEST KEY LAYOUT AND METHOD OF MONITORING PATTERN MISALIGNMENTS USING TEST KEYS

BACKGROUND OF THE INVENTION

1. Field of the Invention

The present invention relates generally to a test key layout and a method of monitoring pattern misalignments using the test key, and more specifically, to a test key layout used in litho-litho-etch (LLE) process and a method of monitoring pattern misalignments using the test key.

2. Description of the Prior Art

Conventional lithographic techniques for exposing a pattern of radiation or light onto a substrate have various challenges that limit the size of features exposed, and limit the pitch or spacing between exposed features. In order to manufacture pattern features with a resolution beyond the limitation of current lithographic techniques, one approach adopted in the industry is to use a conventional lithographic pattern exposed on the same substrate twice followed by etch processes (known as LLE—Litho/Litho/Etch), wherein the process involves the overlapping of two larger latent images formed by the two exposures to obtain desired smaller developed image. As shown in FIG. 1A, the developed pattern 3 is formed by correct alignment of larger first latent pattern 1 and second latent pattern 2, and it will be further transferred to underlying layers through following dry etch processes.

In LLE lithographic techniques, the alignment of the second exposure step is not performed on the basis of the alignment marks of the first exposure pattern. Therefore, if the desired developed pattern in LLE process is not formed by two overlapping latent patterns with low misalignment offset, the resultingly developed pattern is likely to suffer misalignment issue. For example, as shown in FIG. 1B, the second latent pattern 2 is leftward shifted, causing the position of resulting developed pattern 3 to be shifted upwardly out of range of contact region 4 and not positioned at the predetermined center of the contact region 4. The misalignment of upper and lower layer structures is prone to cause poor electrical performance of the product.

Therefore, in order to achieve better product yield in mass production, a correction method for pattern shift resulted from the LLE process is required in current semiconductor industry to test the electrical performance and monitoring the inaccuracy of optical measurement.

SUMMARY OF THE INVENTION

In regard to the above-mentioned process, the present invention provides a test key layout and method of monitoring pattern misalignments using the test keys. The test key layout is provided with multiple test keys to precisely measure the misalignment offset of the layout patterns in a shifting direction.

One purpose of the present invention is to provide a test key layout with multiple test keys, wherein each test key includes an operating voltage ($V_{dd}$) line, two grounding voltage ($V_{ss}$) lines at two sides of the operating voltage line respectively, wherein the two grounding voltage lines and the operating voltage line are spaced apart in a first direction, and a testing electrode on the operating voltage line and the two grounding voltage lines and electrically connecting with at least one of the operating voltage line and the grounding voltage line, wherein the layout pattern of the testing electrode is defined by an overlapping portion of one layout pattern from a first exposure process and one layout pattern from a second exposure process, and the position of testing electrode on each test key is shifted sequentially in the first direction in order of the test keys.

Another purpose of the present invention is to provide a test key layout with multiple test keys, wherein each test key includes an operating voltage line, a grounding voltage line at one side of the operating voltage line and spaced apart from the operating voltage line in a first direction, a first testing electrode on the operating voltage line and the grounding voltage line and electrically connecting with at least one of the operating voltage line and the grounding voltage line, and a second testing electrode on the operating voltage line and the grounding voltage line and electrically connecting with at least one of the operating voltage line and the grounding voltage line, wherein the pattern of test keys is defined by an overlapping portion of one layout pattern from a first exposure process and one layout pattern from a second exposure process, and the length of first testing electrode on each test key is decreased sequentially in the first direction in order of the test keys, and the length of second testing electrode on each test key is increased sequentially in the first direction in order of the test keys.

Still another purpose of the present invention is to provide a method of monitoring layout pattern misalignments, including the steps of providing a set of test keys, wherein each test key includes an operating voltage line spaced apart in a first direction, forming a testing electrode electrically connecting with at least one operating voltage line and grounding voltage line on each test key, wherein the layout pattern of testing electrodes is defined by an overlapping portion of one layout pattern from a first exposure process and one layout pattern from a second exposure process, and the positions of testing electrode on each test key is shifted sequentially in the first direction in order of the test keys, and measuring the resistance of each test key and determine the misalignment offset of layout pattern from first exposure process and layout pattern from second exposure process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 5 is a perspective view of a capacitor and a corresponding test key in accordance with the embodiment of present invention.

Figure 1A:
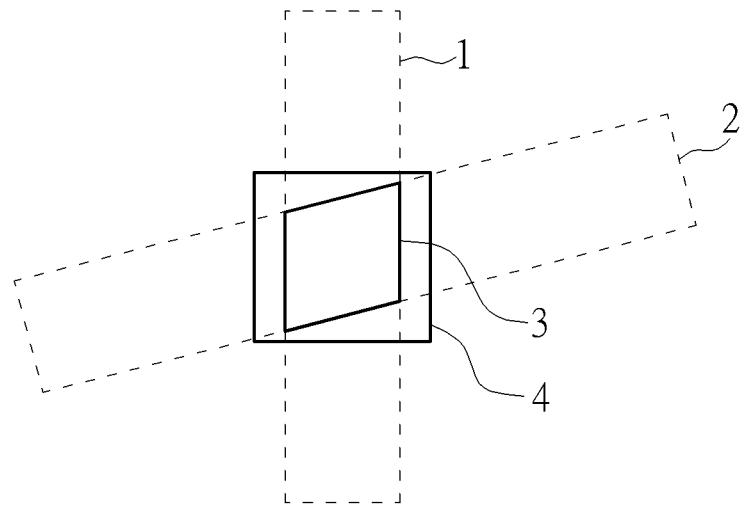
FIG. 1A is schematic layout view illustrating the developed pattern resulted from correct alignment of latent patterns in two exposure processes in prior art.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. In the drawings, the size and relative sizes of components and regions may be exaggerated for clarity unless express so defined herein. It is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 2:
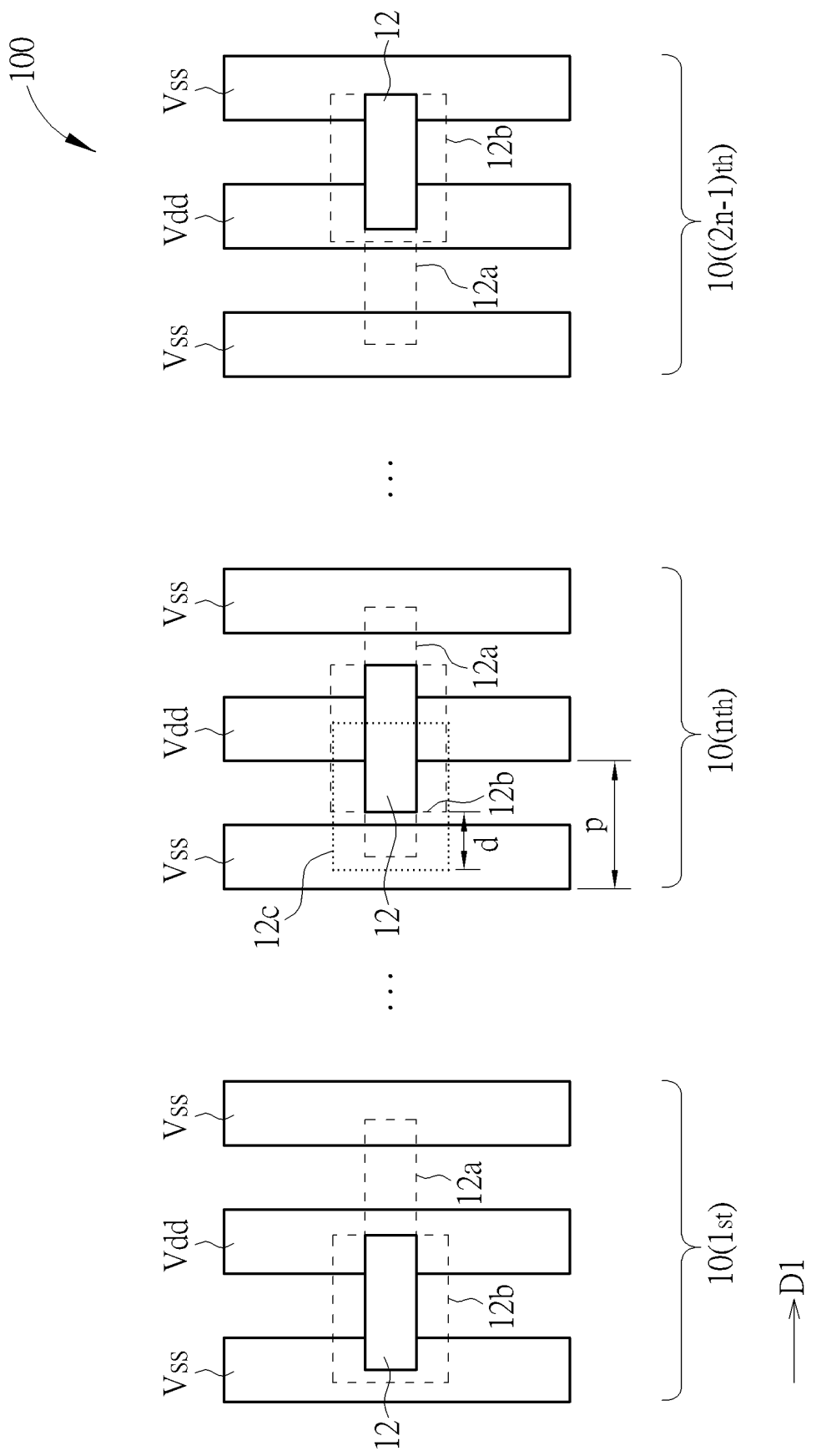
FIG. 2 is a schematic top view illustrating a set of test keys in accordance with the embodiment of present invention.
Figure 4:
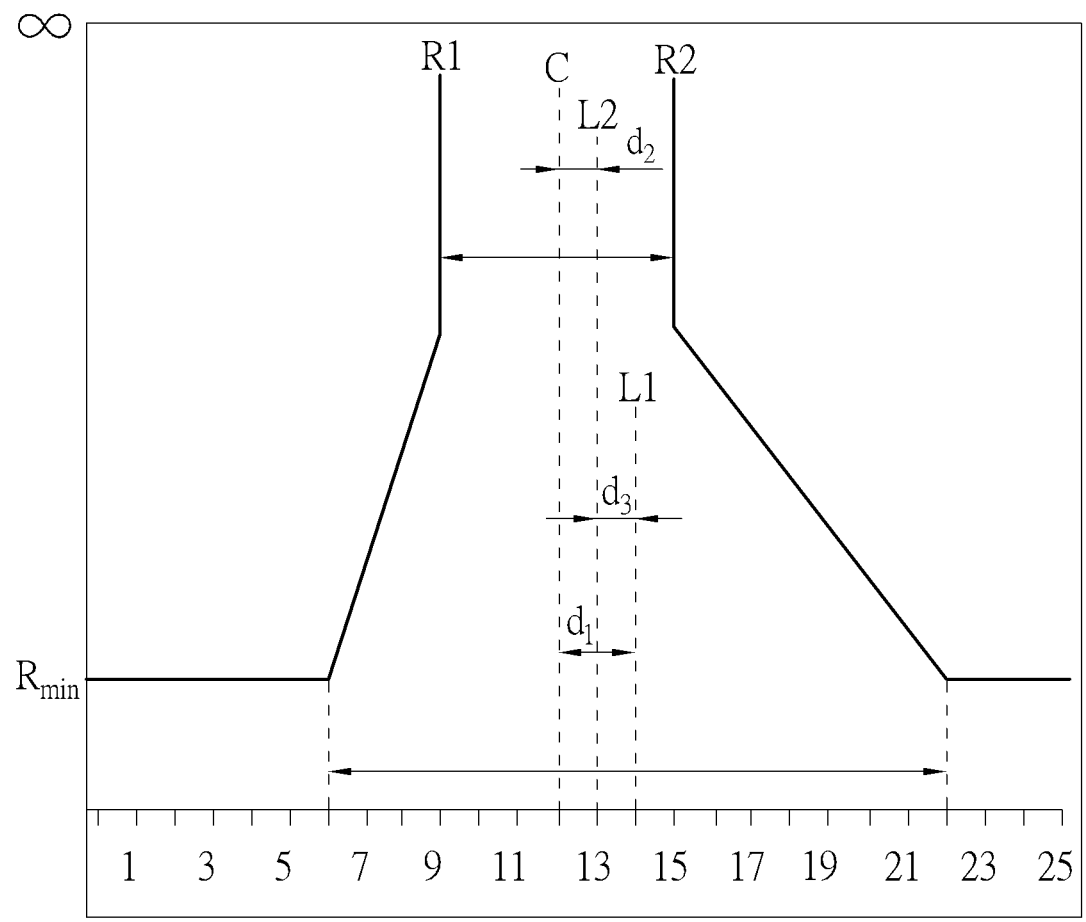
FIG. 4 is a line graph of resistance vs. displacement of the test key layout according to the embodiment of FIG. 3.

First, please refer to FIG. 2, which is a schematic top view illustrating a set of test key layouts 100 in accordance with one embodiment of the present invention. The test key layouts 100 of present invention is composed of multiple test keys 10 in order to achieve the efficacy of measuring subtle offset. The number of test keys 10 is preferably 2n-1, wherein n is positive integer equal or larger than 2. For example, FIG. 4 shows the number of the test keys is 25 in the embodiment, that is, n is 13. Each test key 10 is provided with an operating voltage line $V_{dd}$ and two grounding voltage line $V_{ss}$ respectively at two sides of the operating voltage line, wherein the operating voltage line $V_{dd}$ and the grounding voltage line $V_{ss}$ are spaced apart in a first direction D1. Since the misalignment offset is derived from the resistance in the present invention, a testing electrode 12 should be placed on the operating voltage line $V_{dd}$ and the grounding voltage line $V_{ss}$ and electrically connecting with at least one of them in order to measure the resistance.

In the embodiment of present invention, the testing electrode 12 of test key layout is defined by a litho-litho-etch (LLE) process with two exposure steps. The true required developed pattern would be the overlapping portion of the latent patterns defined by said two exposure steps. In the embodiment of FIG. 2, the position of the latent pattern defined by the first exposure step (referred hereinafter as layout pattern 12a from first exposure process, which is denoted by the dashed frame in the figure) on each test key 10 is identical. For example, the latent pattern is at center of the test key 10 and extends in a first direction D1 so that the latent pattern overlaps the operating voltage line $V_{dd}$ and two grounding voltage line $V_{ss}$.

Unlike the layout pattern 12a from first exposure process, the position of the latent pattern defined by the second exposure step (referred hereinafter as layout pattern 12b from second exposure process, which is denoted by the dashed frame in the figure) on each test key 10 is different. For example, the position of layout pattern 12b from the second exposure process on each test key 10 is shifted sequentially (from $1_{st}$ to $(2n-1)_{th}$) in the first direction D1. Furthermore, the position of layout pattern 12b would overlap at least one of the operating voltage line $V_{dd}$ and the grounding voltage line $V_{ss}$. More specifically, the offset of layout pattern 12b from the second exposure process in the first direction D1 on each test key 10 should be identical. For example, regarding the developed pattern of $n_{th}$ test key in FIG. 2, the position of layout pattern 12b from the second exposure process on the $n_{th}$ test key would locate at a position shifted a predetermined distance d in the first direction D1 from the position of layout pattern 12c on the previous $(n-1)_{th}$ test key. The value d is exactly the pitch of operating voltage line $V_{dd}$ and the grounding voltage line $V_{ss}$ divided by $(2n-2)$.

In the embodiment of present invention, since the pattern of the testing electrode is defined by the overlapping pattern of the first exposure and the second exposure, the offset of layout pattern 12b from the second exposure process on each test key 10 would change the position of the developed pattern of testing electrode 12 (denoted by a solid frame) on the operating voltage line $V_{dd}$ and the grounding voltage line $V_{ss}$. That is, the position of the developed pattern of testing electrode 12 would be shifted sequentially in the first direction D1 in order of the test key 10 (i.e. from $1_{st}$ to $(2n-1)_{th}$). As shown in FIG. 2, when the number of test keys 10 is 2n-1, the position of layout pattern 12b from the second exposure process on the $n_{th}$ test key would be located exactly on the center of the test key, and the pattern position of testing electrode 12 defined by the layout pattern 12a from the first exposure process and the layout pattern 12b from the second exposure process will also be located on the center of the test key.

In the present invention, the position of testing electrode 12 formed on each test key 10 is different and is shifted sequentially in a direction. This design is helpful to measure the resistances in multiple sets of test keys and obtain the line graph of resistance vs. displacement of the test key layout, thereby determining the subtle offset in the alignment of layout pattern from the second exposure process to the layout pattern 12a from the first exposure process. The more the number of test keys 10 disposed in the test key layout 100, the subtler the offset may be measured. This design is very critical and essential in current manufacturing process of memory, especially for current technology node lower than 28 nm. Relevant description about the offset of testing electrodes and the change of resistance will be provided in the following embodiment.

Figure 3:
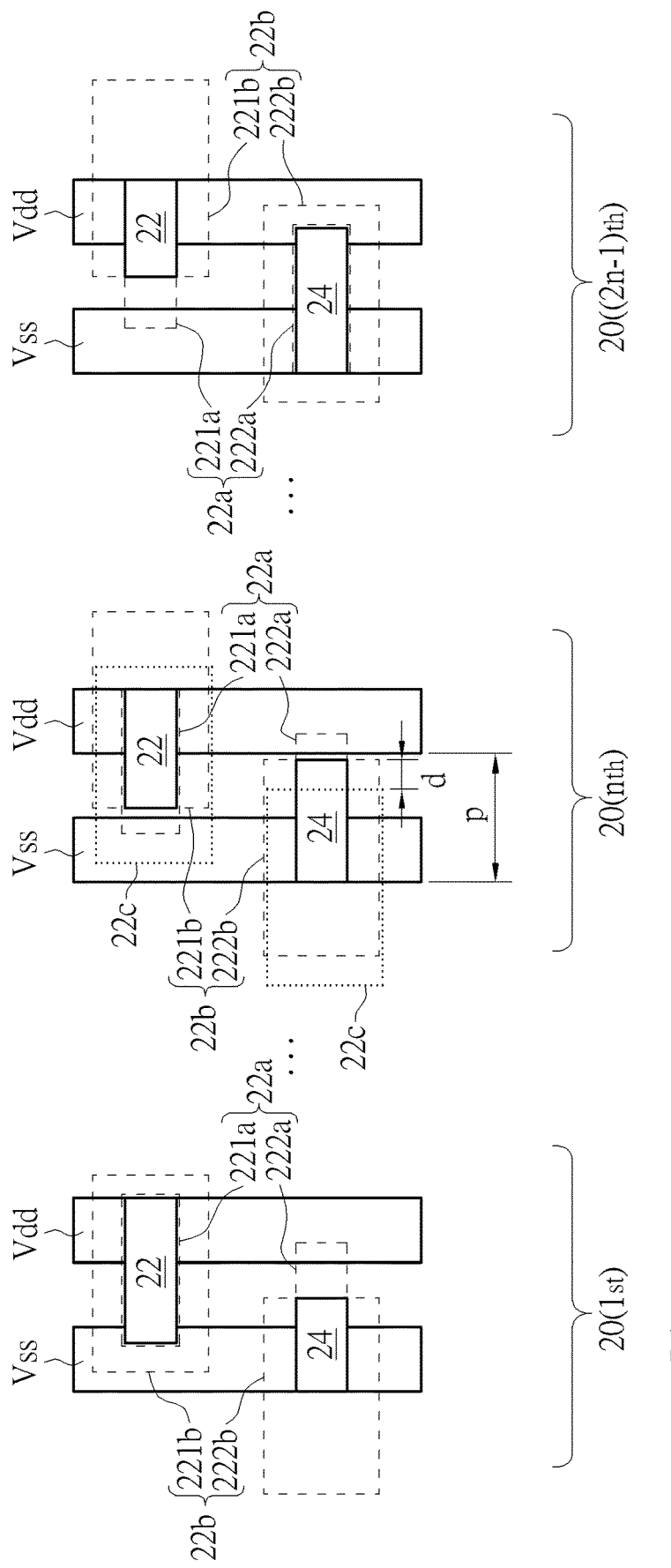
FIG. 3 is a schematic top view illustrating a set of test keys in accordance with another embodiment of present invention.

Please refer to FIG. 3, which is a schematic top view illustrating a set of test keys in accordance with another embodiment of the present invention. Unlike the test key layout 100 in the previous embodiment, the test key layout 200 in this embodiment is provided with only one grounding voltage line $V_{ss}$. This design may reduce the required layout region for the test key. As shown in FIG. 3, the test key layout 200 is composed of multiple test keys 20 to achieve the efficacy of measuring subtle offset. The number of test keys 20 is preferably 2n-1, wherein n is positive integer equal or larger than 2. Each test key 20 is provided with an operating voltage line $V_{dd}$ and a grounding voltage line $V_{ss}$ at one side of the operating voltage line, wherein the operating voltage line $V_{dd}$ and the grounding voltage line $V_{ss}$ are spaced apart in a first direction D1. Since the misalignment offset is derived from the resistance in the present invention, a testing electrode 12 should be placed on the operating voltage line $V_{dd}$ and the grounding voltage line $V_{ss}$ and electrically connecting with at least one of them in order to measure the resistance. Unlike the embodiment in FIG.

Figure 1B:
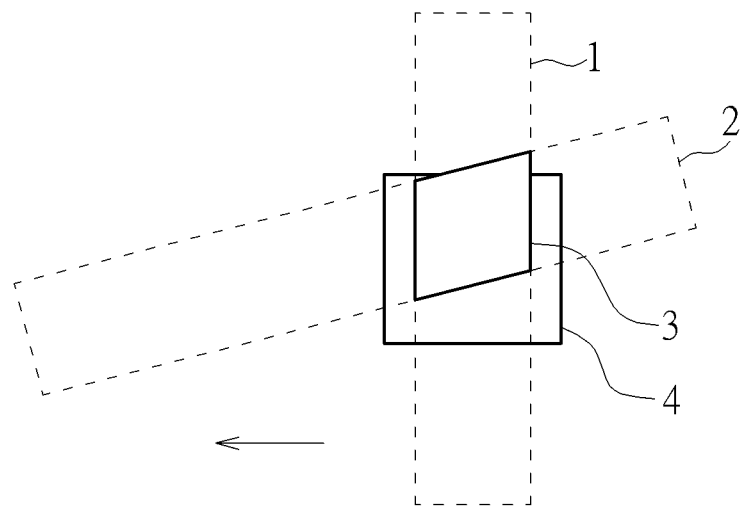
FIG. 1B is schematic layout view illustrating the shifted developed pattern resulted from the misalignment of latent patterns in two exposure processes in prior art.

1A and FIG. 1B, since the present embodiment uses a single grounding voltage line $V_{ss}$ for the purpose of reduced layout region, two testing electrodes 22/24 will be necessary in the test key layout to obtain two resistances at the left section and right section of the test key layout. Relevant details will be described in the following embodiment.

In the embodiment of the present invention, the layout patterns of testing electrodes 22/24 are defined by an LLE process with two exposure steps. The true required developed pattern would be the overlapping portion of the latent patterns defined by said two exposure steps. In the embodiment of FIG. 3, since two patterns for testing electrodes 22/24 should be defined, the latent pattern defined by the first exposure step (referred hereinafter as layout pattern 22a from the first exposure process, which is denoted by the dashed frame in the figure) would include a first portion 221a and a second portion 222a, whose positions on each test key 20 would be identical. For example, the first portion 221a and second portion 222a of the latent pattern would extend respectively in a first direction D1 and in a direction opposite to the first direction D1 from the outer side of the operating voltage line $V_{dd}$ and the grounding voltage line $V_{ss}$ and overlap therewith, wherein the first portion 221a and second portion 222a of the latent pattern are preferably symmetric with respect to middle line in the first direction D1.

Similarly, the latent pattern defined by the second exposure step (referred hereinafter as layout pattern 22b from the second exposure process, which is denoted by the dashed frame in the figure) would also include a third portion 221b and a fourth portion 222b to overlap the first portion 221a and the second portion 222a of the layout pattern 22a from the first exposure process for defining the pattern of two testing electrodes. Unlike the layout pattern 22a from the first exposure process, the layout pattern 22b from the second exposure process, including the third portion 221b and the fourth portion 222b, is shifted sequentially in the first direction D1 on each test key 20 (i.e. from $1_{st}$ to $(2n-1)_{th}$) and would overlap with at least one of the operating voltage line $V_{dd}$ and the grounding voltage line $V_{ss}$. More specifically, the offset of layout pattern 22b from the second exposure process in the first direction D1 on each test key 20 should be identical. For example, regarding the developed pattern of $n_{th}$ test key in FIG. 3, the position of layout pattern 22b from the second exposure process would locate at a position shifted a predetermined distance d in the first direction D1 from the position of layout pattern 22c on the $(n-1)_{th}$ test key. The value d is exactly the pitch of operating voltage line $V_{dd}$ and grounding voltage line $V_{ss}$ divided by 2(2n-2).

In this embodiment, since the pattern of the testing electrode is defined by the overlapping pattern of the first exposure and the second exposure (LLE process), the displacement of layout pattern 22b from the second exposure process would change the lengths of the true developed patterns of testing electrodes 22 and 24 (denoted by a solid line) on the operating voltage line $V_{dd}$ and the grounding voltage line $V_{ss}$. That is, as shown in FIG. 3, the length of first testing electrode 22 on each test key 20 would be decreased sequentially in the first direction D1 in order of the test key 20 (i.e. from $1_{st}$ to $(2n-1)_{th}$), and the length of second testing electrode 24 on each test key 20 would be increased sequentially in the first direction D1 in order of the test key 20. Furthermore, the position of layout pattern 22b from the second exposure process on the $n_{th}$ test key would be exactly symmetric with respect to the middle line of test key in the first direction D1, and the patterns of testing electrodes 22 and 24 defined by the layout pattern 22b from the second exposure process and the layout pattern 22a from the first exposure process would also be symmetric with respect to the middle line of test key.

In this embodiment, the lengths of testing electrodes 22 and 24 formed on each test key 20 are different and increased sequentially in a direction. This design is helpful to measure the resistances in multiple sets of test keys and obtain the line graph of resistance vs. displacement of the test key layout, thereby determining the subtle offset in the alignment of layout pattern from the second exposure process to the layout pattern 22a from the first exposure process. The more the number of test keys 20 disposed in the test key layout 200, the subtler the offset may be measured.

After describing the test key layout of the present invention, the method of monitoring and measuring the pattern misalignment using these layout patterns from the test keys will be described. Regarding a set of test key layouts with multiple test keys, the testing electrode defined by these test keys will be provided with a sequentially shifted position or a sequentially increased or decreased length, thus the contact area of the testing electrode and the underlying operating voltage line $V_{dd}$ and grounding voltage line $V_{ss}$ will also be changed, which will further change the resistance measured from those test keys. Multiple test keys will result in multiple resistances, so that a line graph of resistance distribution based on the order of test keys may be obtained. The misalignment offset of the second exposure pattern may be derived through this line graph. The more the number of test keys disposed in the test key layout, the subtler the offset may be derived and measured.

Please refer now to FIG. 4, which is a line graph of resistances vs. displacements of the test key layout, wherein the x-axis has the number representing the number of the testing pads, the y-axis has the number representing the resistances, line R1 represents the resistance of first testing electrode 22 on different test keys 20, and line R2 represents the resistance of second testing electrode 24 on different test keys 20. Line C in the graph is the middle line of two vertical y-axis. The two testing electrodes 22/24 formed on the $n_{th}$ test key in FIG. 3 will be symmetric with respect to the line C and will not connect with the operating voltage line $V_{dd}$ and the grounding voltage line $V_{ss}$. Line L1 is the middle line between the first turning points of line R1 and line R2, which represents the position of a latent pattern (ex. 12a, 22a) resulted from the first exposure process. The shifted distance d1 between the line L1 and line C is exactly the offset of layout pattern from the first exposure process shifted from its ideal position. Line L2 is the middle line of the entire test key layout (ex. the position of the $n_{th}$ test key), which represents the position of the latent pattern (ex. 12b, 22b) resulted from the second exposure process. The shifted distance d2 between line L2 and line C is exactly the offset of a layout pattern from the second exposure process shifted from its ideal position, and the shifted distance d3 between the line L2 and line L1 is exactly the misalignment offset of layout patterns from the second exposure process aligned to the layout pattern from the first exposure process. The shifted distance d3 is exactly the value we want to derive. In this invention, line L1 and line C may be drawn according to the asymmetry of line R1 and R2. In the case that both of the first exposure process and the second exposure process are perfectly aligned without any misalignment, the line R1 and R2 should be symmetric with respect to the middle line.

In FIG. 4, please refer simultaneously to the layout pattern of FIG. 3 for better understanding. It is shown in the figure that the resistances of the $1_{st}$-$6_{th}$ test keys is minimum resistance $R_{min}$, which represents that the operating voltage line $V_{dd}$ and the grounding voltage lines $V_{ss}$ are electrically connected through the first testing electrode 22 on the $1_{st}$-$6_{th}$ test keys, and the first portion 221a of the layout pattern 22a from the first exposure process and the third portion 221a of the layout pattern 22a from the first exposure process would completely overlap. That is, the first testing electrodes 22 are longest and the operating voltage line $V_{dd}$ and the grounding voltage line $V_{ss}$ have the largest contact areas on the $1_{st}$-$6_{th}$ test keys. From the 6th test key, the layout pattern 22b of the second exposure process starts to shift in the first direction D1, and the second portion 222a and the fourth portion 222b are not completely overlapped, so that the contact area of resulted second testing electrode 24 and the operating voltage line $V_{dd}$ and grounding voltage line $V_{ss}$ gets smaller and the resistance R gets larger. Until the 9th test key, the first portion 221a of layout pattern 22a of the first exposure process starts to disconnect with the grounding voltage line $V_{ss}$. The resistance measured by first testing electrode 22 approaches infinity.

On the other hand, with the layout pattern 22b of the second exposure process continues to shift in the first direction D1, the fourth portion 222b on the $15_{th}$ test key would start to overlap with the operating voltage line $V_{dd}$, so that the operating voltage line $V_{dd}$ and grounding voltage line $V_{ss}$ start to be electrically connected by the resulted second testing electrode 24. Started from the $15_{th}$ test key, their contact area would get larger, thus the resistance measured by the second testing electrode 24 would get smaller from the infinity value, until to the minimum resistance $R_{min}$ of the $22_{th}$ test key. According to the resistance distribution based on the number of test keys in the line graph, line L1 and line L2 may be easily drawn on the graph to derive the offset d3 therebetween.

Please refer next to FIG. 5, which is a perspective view of a capacitor and a corresponding test key in accordance with the embodiment of the present invention. This figure explains the application of measuring the offset between a capacitor and underlying capacitor pad. In order to simplify the drawing and clarify the principle of offset measurement in the present invention, conventional elements such as dielectric layers and photoresist will not be shown in the figure.

In this embodiment, the operating voltage line $V_{dd}$, the grounding voltage line $V_{ss}$, and the capacitor pad 30 are formed in advance in previous processes, wherein the capacitor pad 30 is further connected to a word line 34 through underlying contact 32. The capacitor pad 30 and the grounding voltage line $V_{ss}$ are formed in the same photolithographic and etch process, so that they will have identical misalignment conditions. The pattern of capacitor 36 to be formed on the capacitor pad 30 is defined by an overlapping portion of the layout pattern 12a from a first exposure process and the layout pattern 12b from a second exposure process. This process may involve the use of negative tone development to form a photoresist layer with the capacitor patterns on a dielectric layer (not shown). An etch process is then performed to form the openings for the capacitors, and the capacitor 36 is formed in the opening.

Please note that, as shown in the figure, both of the layout pattern 12a from the first exposure process and the layout pattern 12b from the second exposure process include the latent patterns of the capacitor in a memory region and the latent patterns of a test key layout in the testing region. Therefore, if the first exposure process and/or the second exposure process suffers the misalignment issue, the resulted patterns of capacitor 36 and testing electrode 12 would have the same misalignment basis with respect to the capacitor pad 30, the operating voltage line $V_{dd}$ and the grounding voltage line $V_{ss}$ thereunder. The resulted testing electrode 12 would truly reflect the misalignment condition of the capacitor 36 on the capacitor pad 30 formed in the same process. They will have identical misalignment offset with respect to the capacitor pad 30 and the operating voltage line $V_{dd}$ and the grounding voltage line $V_{ss}$ thereunder. The measurement of resistance of each test key 10 is like the one used when describing FIG. 4. The line graph of resistance vs. displacement of the test key layout will be drawn based on the measured data, and may be further used to derive the misalignment offset of the first exposure process and the second exposure process, as the value d3 shown in FIG. 4. This is exactly the offset of capacitor 36 and the capacitor pad 30 manufactured in practical semiconductor processes.

Process issues may be perceived through the measured offset described in the embodiment above. For example, in the embodiment of FIG. 5, larger offset between the capacitor 36 and the capacitor pad 30 reflects that they are not correctly aligned and contacted, which may further induce electrical performance issues of the products. Upfront testing for this misalignment issue may avoid the low yield in mass production and may perform an inspection and adjustment for the involved photolithographic process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key layout, comprising multiple test keys, wherein each said test key comprises:
    an operating voltage ($V_{dd}$) line;
    two grounding voltage ($V_{ss}$) lines at two sides of said operating voltage line, respectively, wherein said two grounding voltage lines and said operating voltage line are spaced apart in a first direction; and
    a testing electrode electrically connecting with at least one of said operating voltage line and said two grounding voltage lines;
    wherein a layout pattern of said testing electrode is defined by an overlapping portion of one layout pattern from a first exposure process and one layout pattern from a second exposure process, and a position of said testing electrode on each said test key is shifted sequentially in said first direction in order of said test keys.

2. The test key layout of claim 1, wherein said layout pattern from the first exposure process extends in said first direction and overlaps said operating voltage line and said two grounding voltage lines.

3. The test key layout of claim 1, wherein said layout pattern from the second exposure process on each said test key is shifted a predetermined distance in said first direction in order of said test keys and overlaps at least one of said operating voltage line and said two grounding voltage lines.

4. The test key layout of claim 3, wherein the number of said test keys in said test key layout is 2n-1, and said n is positive integer between 2 and 13.

5. The test key layout of claim 4, wherein said predetermined distance is equal to a pitch of said operating voltage line and said two grounding voltage lines divided by 2n-2.

* * * * *